(12) United States Patent
Jeon

(10) Patent No.: US 7,929,357 B2
(45) Date of Patent: Apr. 19, 2011

(54) DATA OUTPUT BUFFER CIRCUIT AND SEMICONDUCTOR MEMORY DEVICE INCLUDING THE SAME

(75) Inventor: Young-Jin Jeon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 169 days.

(21) Appl. No.: 12/292,736

(22) Filed: Nov. 25, 2008

(65) Prior Publication Data
US 2009/0168549 A1 Jul. 2, 2009

(30) Foreign Application Priority Data

Jan. 2, 2008 (KR) .................. 10-2008-0000202

(51) Int. Cl.
*G11C 7/00* (2006.01)
(52) U.S. Cl. ............... 365/189.05; 365/189.08; 365/194
(58) Field of Classification Search ............. 365/189.05, 365/189.08, 194
See application file for complete search history.

(56) References Cited

U.S. PATENT DOCUMENTS

| | | | |
|---|---|---|---|
| 6,646,483 B2 * | 11/2003 | Shin | 327/112 |
| 2003/0025541 A1 * | 2/2003 | Humphrey et al. | 327/170 |
| 2003/0042953 A1 * | 3/2003 | Shin | 327/170 |
| 2004/0165449 A1 * | 8/2004 | Pan | 365/189.05 |
| 2005/0231251 A1 | 10/2005 | Im et al. | |
| 2007/0069784 A1 * | 3/2007 | Shin et al. | 327/170 |
| 2007/0126477 A1 | 6/2007 | Rho | |

FOREIGN PATENT DOCUMENTS

| | | |
|---|---|---|
| JP | 2007-166603 | 6/2007 |
| KR | 10-0640782 | 10/2006 |
| KR | 10-2007-0036554 | 4/2007 |
| KR | 10-0693922 | 6/2007 |

* cited by examiner

*Primary Examiner* — Hoai V Ho
(74) *Attorney, Agent, or Firm* — Harness, Dickey & Pierce, P.L.C.

(57) ABSTRACT

The example embodiments provide a data output buffer circuit which includes a pre-driver configured to adjust a slew rate of an input signal, a main driver configured to output signal supplied from the pre-driver, and a ZQ calibration circuit configured to control the pre-driver so as to decrease the slew rate when an operation voltage increases, and increase the slew rate when the operation voltage is decreased.

19 Claims, 6 Drawing Sheets

DATA OUTPUT BUFFER CIRCUIT AND SEMICONDUCTOR MEMORY DEVICE INCLUDING THE SAME

PRIORITY STATEMENT

The U.S. non-provisional patent application claims priority under 35 U.S.C. §119 to Korean Patent Application No. 10-2008-0000202, filed on Jan. 2, 2008, in the Korean Intellectual Property Office, the entire contents of which are incorporated herein by reference.

BACKGROUND

1. Field

Example embodiments relate to a data output buffer circuit and a semiconductor device including the same (e.g. a data output buffer circuit which ensures signal quality irrespective of variation in operation voltage).

2. Description of Conventional Art

A semiconductor memory device may include a plurality of memory cells for retaining data. Data is stored in the memory cells during a write operation, and the data stored in the memory cells may be read during a read operation. The semiconductor memory device includes a data output buffer circuit, which outputs the read data to an external device.

Recently, data transmission between semiconductor memory devices is becoming increasingly high-speed. To accommodate this trend, signal amplitudes of transmissions flowing through an electronic system are reduced to permit data transmissions at high-speeds. In light of this approach, impedance matching may be employed to prevent amplitude variations of small amplitude data signals. In particular, matching the input impedance of a semiconductor memory device to the output impedance of the same reduces the variations. The input impedance of a semiconductor memory device is the impedance of the transmission path, which may include other semiconductor memory devices. The output impedance of the semiconductor memory device is equal to the impedance of the data output buffer circuit. During data transmission, if the impedance of the input and output are not matched accurately, the small amplitude data signal may become blunt, or be subject to over-shoot or under-shoot phenomena.

For such a reason, the output impedance of the data output buffer circuit of the semiconductor memory device must maintain a designated value and must be adjusted to match the impedance of the transmission path between semiconductor memory devices. However, the output impedance of the data output buffer circuit may vary according to the variation of an operation voltage (VDD).

One approach to maintaining matching impedances is by implementing a data-double-rate-3 (DDR3) memory device. Normally, the impedance of a data output buffer circuit tends to decrease as the operation voltage VDD decreases, and increase as the operation voltage VDD increases. Nevertheless, the data output buffer circuit of a DDR3 memory device may include a ZQ calibration circuit. A ZQ calibration circuit may lower the output impedance of the data output buffer circuit as the operation voltage VDD increases, and may raise the output impedance of the data output buffer circuit as the operation voltage VDD decreases. In other words, the ZQ calibration circuit adjusts the output impedance of the data output buffer circuit so as to be inversely proportional to the operation voltage VDD, which permits the operational voltage VDD to be maintained at a desired level. Accordingly, the ZQ calibration circuit maintains the output impedance of the data output buffer circuit at desired value so as to permit impedance matching with the impedance of the transmission path.

However, a ZQ calibration circuit may not achieve ideal impedance matching. Although output impedance Zout of the data output buffer circuit is maintained at a desired value through use of a ZQ calibration circuit, data output may still be influenced by the slew rate of an output signal. A slew rate is the slope of an output signal, which may vary under certain conditions. If the slew rate is too low, the variation width of access time increases and may result in signal quality deterioration. If the slew rate is too high, signal quality may also deteriorate due to bounce noise. Signal quality may be referred as "signal integrity."

The slew rate of an output signal may be determined while designing a semiconductor memory device. Among the different design determinations, transistor size or resistance may indicate the degree of the signal slew rate. However, such a design determinations may still not accurately depict the slew rates, as the slew rate may vary according to the operation voltage VDD.

When the operation voltage VDD rises, the slew rate of the data output buffer circuit may increase. Likewise, when the operation voltages VDD lowers, the slew rate of the data output buffer circuit may decrease. In order to ensure a normal signal quality, minimum and maximum slew rate values have been suggested to ensure the signal quality of data output buffer circuit. Even still, signal quality may not be ensured if slew rate variations exceed either the maximum or minimum slew rate values.

SUMMARY

Exemplary embodiments of the present invention are related to a data output buffer circuit and a semiconductor memory device including the same.

According to example embodiments, a data output buffer circuit may comprise a pre-driver, a main driver, and a calibration unit. The pre-driver may be configured to adjust a slew rate of an input signal. The main driver may be configured to drive an output unit in response to the output signal from the pre-driver. The calibration circuit may be configured to control the pre-driver so as to decrease the slew rate when an operation voltage increases, and increase the slew rate when the operation voltage is decreases.

According to another example embodiment, a semiconductor memory device may comprise a cell array, a row and column decoder, and a data output buffer. The cell array may include including a plurality of memory cells arranged in intersections of the rows and columns. The row decoder and column decoder may be configured to select locations of memory cells in response to address information. The data output buffer circuit may be configured to output data read from selected memory cells, wherein the data output buffer circuit includes the data output buffer circuit described in the preceding paragraph.

According to yet another example embodiment, a data output buffer circuit may comprise a pre-driver, a main driver and a calibration unit. The pre-driver may be configured to adjust a slew rate of an input signal, the pre-driver including at least a first pre-driver and a second pre-driver. The main driver may be configured to drive an output unit in response to the output signal from the pre-driver. The calibration circuit may be configured to control the pre-driver such when the operation voltage increases, the slew rate decreases, and when the operation voltage decreases the slew rate increases.

BRIEF DESCRIPTION OF THE FIGURES

The accompanying drawings are included to provide a further understanding of example embodiments, and are incorporated in and constitute a part of this specification. In the figures.

DETAILED DESCRIPTION OF EXAMPLE EMBODIMENTS

Figure 1:
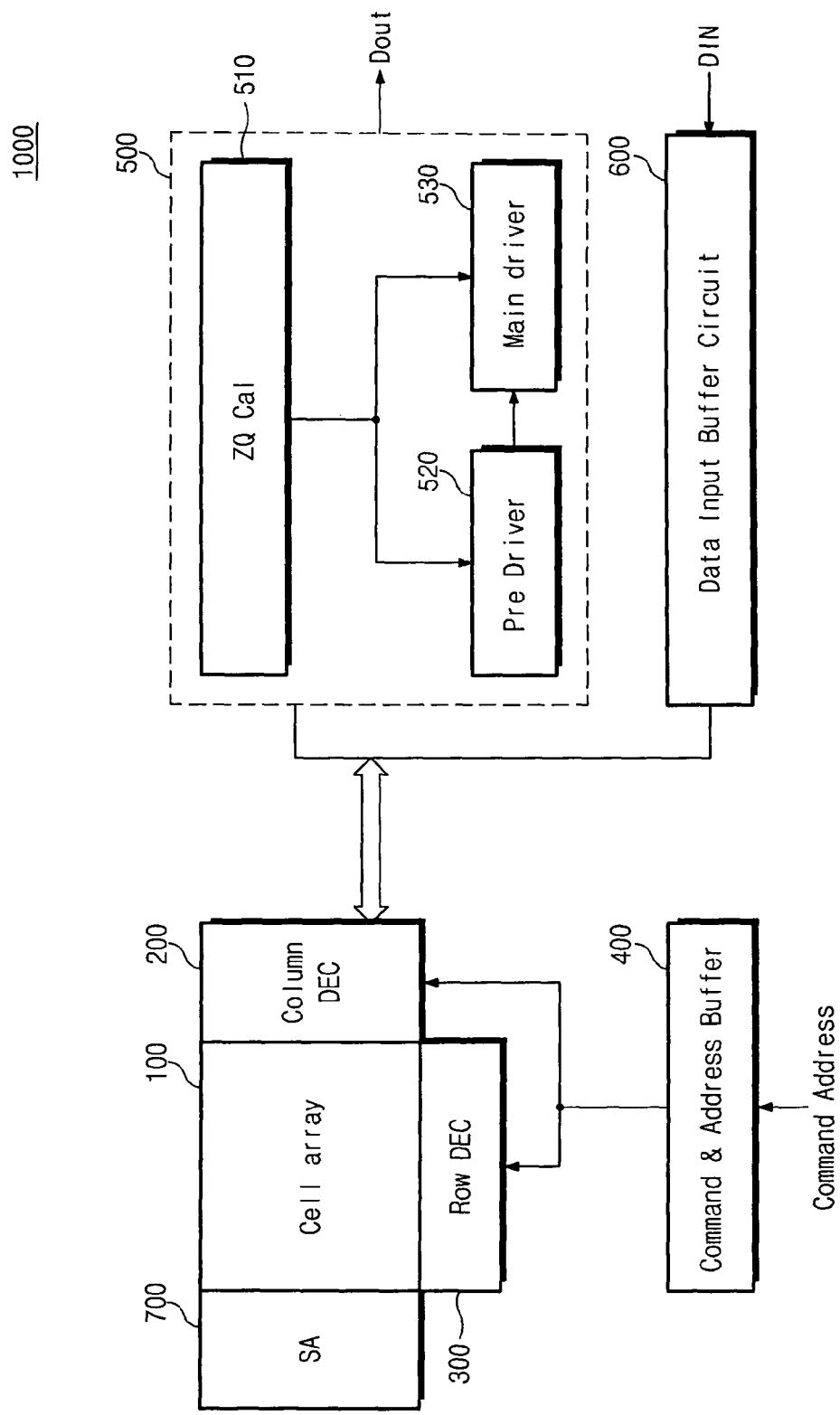
FIG. 1 is a block diagram of a semiconductor memory device 1000 according to an example embodiment.

Example embodiments may be embodied in many different forms and should not be construed as being limited to the embodiments set forth herein; rather, these embodiments may be provided so that this disclosure will be thorough and complete, and will fully convey the concept of example embodiments to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram of a semiconductor memory device 1000 according to an example embodiment of the present invention. The semiconductor memory device 1000 includes a cell array 100, a column decoder 200, a row decoder 300, a command and address buffer 400, a data output buffer circuit 500, a data input buffer circuit 600, and a sense amplifier 700. The semiconductor memory device 1000 may be a DDR3 memory device. The respective functions of block of cell array 100, column decoder 200, a row decoder 300, command and address buffer 400, data input buffer circuit 600, and sense amplifier 700 of the semiconductor memory device 1000 are well-known, therefore only a brief discussion of their operation is provided. In contrast, a detailed discussion is provided as to the data output buffer circuit 500 according to example embodiments. Also, configuration of blocks required in the example embodiments are described briefly.

The cell array 100 may include a plurality of memory cells arranged at intersections of rows and columns. The row decoder 300 and the column decoder 200 may perform selection of locations of memory cells in response to commands and addresses provided from an external device. The commands include a row address strobe (RAS) signal, a column address strobe (CAS) signal, and a write enable (WE) signal. These are commands for row access and column access in a DRAM operation. The RAS signal may be activated and a row address is inputted simultaneously, then the inputted row address is decoded by the row decoder 300. When a plurality of cells are activated by the decoded row address, small signals stored in DRAM cells are amplified by the sense amplifier 700. In other words, the sense amplifier 700 may serve as a data cache which waits for a read operation or a write operation while retaining the amplified data.

During a read operation, when a CAS signal is activated, a column address is simultaneously decoded and the sense amplifier provides a portion of data to the data output buffer 500 by means of the decoded column address. Thereafter, the data output buffer circuit 500 outputs the read data, which is stored in the memory cells selected by the column decoder 200 and the row decoder 300. The data output buffer circuit 500 may output data after a desired period of time (or, alternatively, a predetermined period of time).

During a write operation, the column decoder 200 and row decoders 300 store input data into selected memory cells selected, the input data being introduced by the data input buffer circuit 600. To ensure the quality of the output data signal, the data output buffer circuit 500 may maintain the output impedance at a desired level (or, alternatively, a predetermined level) regardless of a variation in operation voltage VDD.

The data output buffer may include a calibration unit (e.g. ZQ calibration unit). For example, the data output buffer circuit 500 includes a ZQ calibration circuit 510, a pre-driver 520, and a main driver 530. The ZQ calibration circuit 510 adjusts output impedance of the main driver 530 to be maintained at a predetermined level regardless of variation in the operation voltage VDD. Also, the ZQ calibration circuit 510 controls the pre-driver 520 so that it remains stable. Stability may be achieved by maintaining a slew rate of the data output buffer circuit 500 between a desired (or, alternatively, a predetermined) minimum and maximum slew rates, regardless of variation in the operation voltage VDD.

The ZQ calibration circuit 510 may generate an m-bit binary code corresponding to a variation in the operation voltage VDD. The ZQ calibration circuit 510 may decode the generated m-bit binary code into an n-bit signal. The ZQ calibration circuit 510 may supply the pre-driver 520 and/or the main driver 530 with either the m-bit binary code or n-bit signal. The m-bit binary code may have a lower value as the operation voltage VDD increases, and a higher value as the operation voltage VDD decreases. This relationship may also be an inversely proportional relationship.

The ZQ calibration circuit 510 controls both the pre-driver 520 and the main driver 530 by sending either the m-bit binary code or the n-bit signal to one of, or both of, the drivers. For example, assuming that an m-bit binary is code generated by the ZQ calibration circuit 510 and that it is a 5-bit binary code, the operation of the ZQ calibration circuit is as follows. If the 5-bit binary code is "00000", the operation voltage VDD is at its maximum value. If it is "11111", the operation voltage VDD is at its minimum value.

However, in another example, the ZQ calibration circuit 510 may instead send the n-bit signal, which is decoded from the m-bit binary code. Considering the above 5-bit binary code example, the ZQ calibration circuit 510 may decode the 5-bit binary code into a 32-bit signal. Therefore, the ZQ calibration circuit 510 may express the variations in the operation voltage VDD in 32 different values. The 32-bit signal may be supplied to the main driver 530 of the pre-driver 520.

The pre-driver 520 determines a logic state of the output data, and maintains the main driver 530 at a high impedance state (Hi-Z) when there is no output data. The pre-driver 520 then sends the data signal to the main driver 530. Finally, the main driver 530 outputs a data signal with a stable slew rate. Thus, data output buffer circuit 500 permits the semiconductor memory device 1000 to be capable of ensuring signal quality, irrespective of a variation in the operation voltage VDD.

Figure 2:
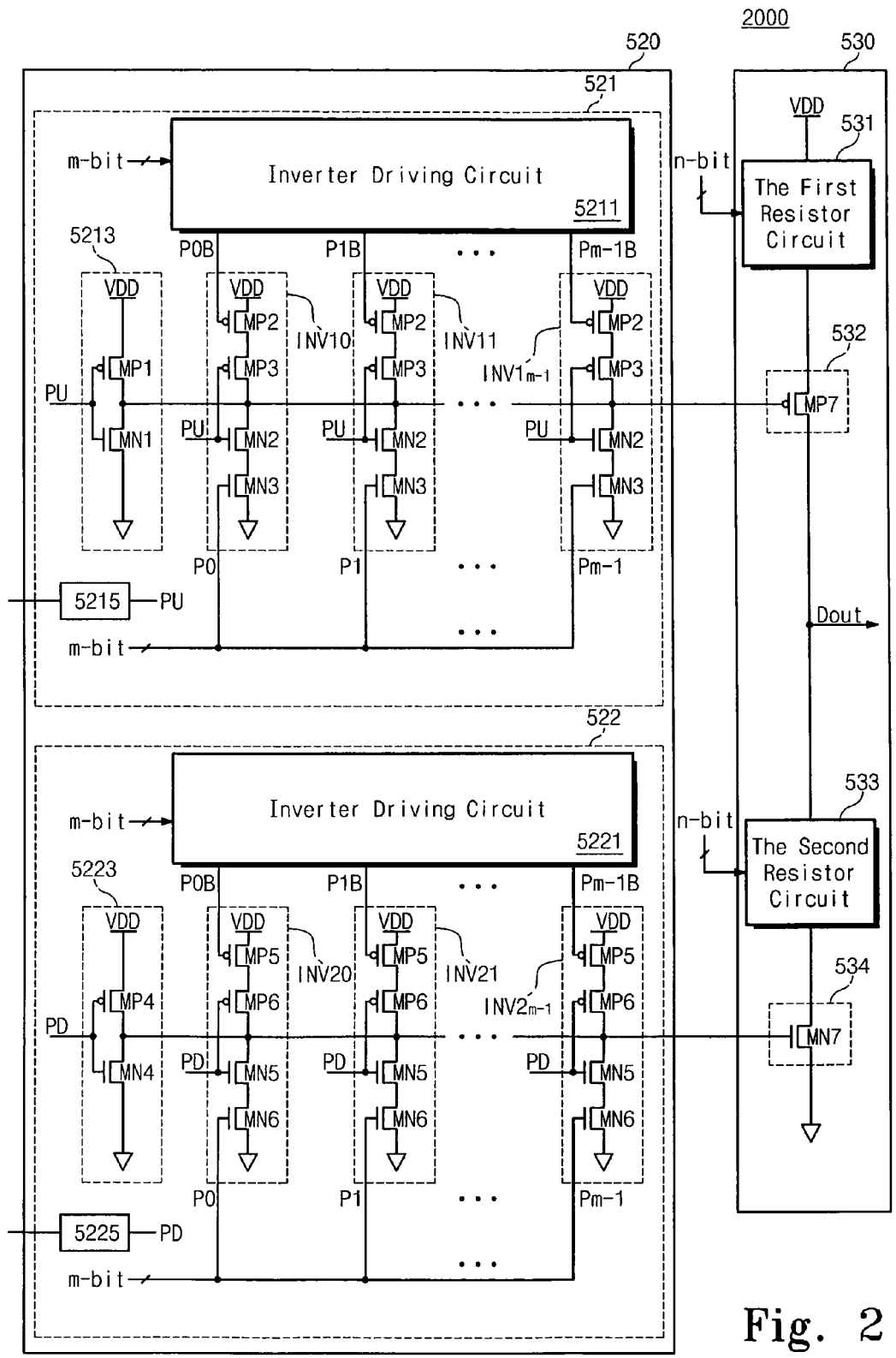
FIG. 2 is a block diagram of a pre-driver 520 and a main driver 530 according to an example embodiment.

FIG. 2 illustrates the drivers 2000 of FIG. 1, which include block diagrams of the pre-driver 520 and the main driver 530 according to an example embodiment. The pre-driver 520 includes a first pre-driver 521 and a second pre-driver 522. The main driver 530 includes a first resistor circuit 531, a pull-up driver 532, a second resistor circuit 533, and a pull-down driver 534. The pull-up driver 532 consists of PMOS transistors, and the pull-down driver 534 consists of NMOS transistors.

The first pre-driver 521 includes an inverter driving circuit 5211, pre-up data input unit 5215 (PU), a first inverter 5213, and a plurality of tri-state inverters INV10-INV1m-1. The second pre-driver 522 includes a second inverter driving circuit 5221, a second inverter 5223, and a plurality of tri-state inverters INV20-INV2m-1. The inverter driving circuit 5211 and inverter driving circuit 5221 each may output identical control signals P0B-Pm-1B. Thus, the inverter driving circuit 5211 and inverter driving circuit 5221 may be named identically.

In the first pre-driver 521, the tri-state inverters INV10-INV1m-1 may have the same configuration. Each of the tri-state inverters INV10-INV1m-1 may include two PMOS transistors (MP2 and MP3) and two NMOS transistors (MN2 and MN3). The gate of the PMOS transistor MP2 is supplied with a control signal from the inverter driving circuit 5211, and the gate of the NMOS transistor MN3 is supplied with a control signal from the ZQ calibration circuit 510. The gate of the PMOS transistor MP3 and the gate of the NMOS transistor MN2 may be supplied with input signals passing through a pre-up data input unit 5215. The source of the PMOS transistor MP2 is supplied with an operation voltage VDD, and its drain is connected to the source of the PMOS transistor MP3. The drain of the PMOS transistor MP3 and the drain of the NMOS transistor MN2 are connected to the output of the first inverter 5213. The source of the NMOS transistor MN2 is connected to a drain of the NMOS transistor MN3, and the source of the NMOS transistor MN3 is connected to ground. The tri-state inverters INV11-INV1m-1 have the same configuration of tri-state inverter INV10. Likewise, tri-state inverters INV20-INV2m-1 have the same configuration with the tri-state inverter INV10, except that they are provided with signals inputted through the pre-down data input unit 5225 (PD). Also, tri-state inverters INV20-INV2m-1 are connected to the output of the second inverter 5223.

The width of the transistors that constitute tri-state inverters INV11-INV1m-1 (MP2, MP3, MN2, MN3) may increase by multiples of two. For example, an example embodiment includes a first pre-driver 521 with five tri-state inverters (INV10-INV14). In such an example embodiment, the width ratio of the transistors that make up the tri-state inverters INV10-INV14 may be 1:2:4:8:16. Likewise, the ratio in the widths of the tri-state inverters INV10-INV14 themselves may also be 1:2:4:8:16. Also, the tri-state inverters INV20-INV2m-1 may be configured to have the same ratio as the tri-state inverters INV11-INV1m-1.

The first inverter 5213 of the first pre-driver 521 and the second inverter 5223 of the second pre-driver 522 may each invert input signals. The first inverter 5213 receives an input signal from the pre-up data input unit 5215. The first inverter 5213 then supplies an inverted signal to the pull-up driver 532 of the main driver 530. The inverted signal passes through the first tri-state inverters INV10-INV1m-1. The signal supplied to the main driver 530, which passes through the first tri-state inverters INV10-INV1*m*-1, is a pull-up driver signal.

The second inverter 5223 receives an input signal from the pre-down data input unit 5225. The second inverter 5223 then supplies the inverted signal to the pull-down driver 534 of the main driver 530. The inverted signal passes through the second tri-state inverters INV20-INV2*m*-1. The signal supplied to the main driver 530, which passes through the second tri-state inverters INV20-INVm-1, is a pull-down driver signal.

Control signals P0B-Pm-1B for controlling activation of the tri-state inverters INV10-INV1*m*-1 may be generated by the inverter driving circuit 5211 and/or the inverter driving circuit 5221. Both the first inverter driving circuit 5211 and the second inverter driving circuit may generate the control signals P0B-Pm-1B in response to the m-bit signal supplied by the ZQ calibration circuit 510. The control signals P0-Pm-1 are also m-bit signals supplied from the ZQ calibration circuit 510.

Control signals P0B-Pm-1B and P0-Pm-1 from the first inverter driving circuit 5211 control the tri-state inverters INV10-INV1*m*-1. The tri-state inverters INV10-INV1*m*-1, in turn, adjust the slew rate of the signal supplied by the first inverter 5213. Likewise, control signals P0B-Pm-1B and P0-Pm-1 from the second inverter driving circuit 5221 control the tri-state inverters INV20-INV2*m*-1. The tri-state inverters INV20-INV2*m*-1, in turn, adjust the slew rate of the signal supplied by the second inverter 5223.

The main driver 530 drives an output unit in response to an output signal from the pre-driver 520. The ZQ calibration circuit 510 controls the first resistor circuit 531 and the second resistor circuit 533 of the main driver 530 to adjust a resistance value.

As previously stated, the pre-driver 520 determines a logic state of the output data and also maintains the main driver 530 in a high impedance state (Hi-Z) when there is no output data. When the input of the pre-up data input unit 5215 is low-level data L, and the input of the pre-down data input unit 5225 is high-level data H, the first inverter 5213 and the second inverter 5223 inverse their respective input signals. As a consequence, the pull-up driver 532 and the pull-down driver 534 of the main driver 530 are switched to an off-state by the inversed signals. Thus, the output Dout of data output buffer 110 maintains a high-impedance Hi-Z.

When the input of both the pre-up data input unit 5215 and the pre-down data input unit 5225 is high-level data, the first inverter 5213 and the second inverter 5223 inverse their respective input signals to a low level L. As a consequence, the inversed low level signals L cause the pull-up driver 532 to be switched to an on-state, and the pull-down driver 534 to be switched to an off-state. As a result, the main driver 530 outputs a high-level signal H.

When the input of both the pre-up data input unit 5215 and the pre-down data input unit 5225 is low-level data L, the first inverter 5213 and the second inverter 5223 inverse their respective input signals to a high level H. As a consequence, the inversed high level signals H cause the pull-up driver 532 to be switched to an off-state, and the pull-down driver 534 to be switched to an on-state. As a result, the main driver 530 outputs a low-level signal L.

The first and second resistor circuits 531 and 533 may include a plurality of PMOS transistors (not shown) connected in parallel. The plurality of PMOS transistors may be turned on or off in response to n-bit signals supplied from the ZQ calibration circuit 510 (e.g. a 32-bit signal). For example, an increase in the operation voltage VDD causes the ZQ calibration circuit 510 to generate an m-bit binary code having low values. If the m-bit binary code is a 5-bit binary code, the ZQ calibration circuit 510 decodes the 5-bit binary code to a 32-bit signal (n-bit signal). As a result, an increase in the operation voltage VDD coincides with an increase in the number of data bits corresponding with a low level value in the 32-bit signal. This causes a greater number of PMOS transistors in the first and second resistor circuits 531 and 532 to be turned on. Since the PMOS transistors are connected in parallel, the first and second resistor circuits 531 and 533 are adjusted so that they have low impedances.

Therefore, when the operation voltage VDD increases, the 32-bit signal supplied from the ZQ calibration circuit 510 adjusts the first and second resistor circuits 531 and 533 to have low impedances. In contrast, when the operation voltage VDD decreases, the opposite takes place. As a result, the output impedance of the main driver 530 is maintained at a desired level (or, alternatively, a predetermined level) by the ZQ calibration circuit 510.

In the example embodiment in FIG. 2, the ZQ calibration unit may supply a 5-bit binary code as the m-bit binary code. In such a case, the 5-bit binary code may be used as five control signals P0-P4. The five control signals P0-P4 are inversely proportional to the value of the operation voltage VDD. Also, the 5-bit binary code supplied from the ZQ calibration circuit 520 is inversed by inverter driving circuit 5211 and inverter driving circuit 5221. The inversed 5-bit binary code may be used as control signals P0B-P4B, opposite of control signals P0-P4. For example, if the 5-bit binary code is "11100", the control signals P0-P4 are expressed as "11100", and the control signals P0B-P4B are expressed as "00011."

When the operation voltage VDD increases, the value of the 5-bit binary code generated by the ZQ calibration circuit 510 may be "11000". The 5-bit binary code value "11000" is a decimal number "3". The five control signals P0-P4 are expressed as "11000." The inverter driving circuit 5211 and the inverter driving circuit 5221 each generate five control signals P0B-P4B, expressed as "00111." If each of the pre-drivers 521 and 522 include 5 tri-state inverters, the "11000" binary code causes the tri-state inverters INV10, INV11, INV20, and INV21 to be activated, while simultaneously deactivating tri-state inverters INV12-INV14, and INV22-INV24.

In the above 5-bit binary code example, size rates of the tri-state inverters INV10-INV14, and INV20-INV24 are 1:2:4:8:16. Accordingly, the sum of the sizes of the activated tri-state inverters INV10 and INV11 and the sum of sizes of the activated tri-state inverters INV20 and INV21 are both equal to a value corresponding to the 5-bit binary code value "11000" (or, decimal number "3"). If the operation voltage VDD further increases, the 5-bit binary code value generated in the ZQ calibration circuit 510 may be "01000" or lower. The increased operation voltage VDD causes the sum of the sizes of the activated tri-state inverters to decrease.

In contrast, when the operation voltage VDD decreases, the 5-bit binary code value generated by the ZQ calibration circuit 510 may be "11110". The 5-bit binary code value "11110" is a decimal number "15". The five control signals P0-P4 may be expressed as "11110." The first and third inverter drive circuits 5211 and 5221 each generate five control signals P0B-P4B expressed as data "00001" in response to the 5-bit binary code supplied from the ZQ calibration circuit 510. Therefore, tri-state inverters INV10-INV13 and INV20-INV23 are activated, and tri-state inverters INV14 and INV24 are deactivated. Since the ratio in the widths of the tri-state inverters INV10-INV14 and INV20-INV24 is 1:2:4:8:16, the sum of the sizes of the activated tri-state inverters INV10-INV13 and INV20-INV23 corresponds to the 5-bit binary code "11110." Accordingly, a decrease in the operation voltage VDD causes the 5-bit binary code to be a higher value, such that there is an increase in the sum of the sizes of the activated tri-state inverters.

The operation voltage VDD and the width of the MOS transistors inside an activated tri-state inverter 5213 can affect the slew rate of an input signal. When both the operation voltage VDD and the widths of the MOS transistors increase, the slew rate of the input signal from the pre-up data input unit 5215 and the pre-down data input unit 5225 may increase. In contrast, when the operation voltage VDD and the widths of the MOS transistors decrease, the slew rate of the input signal from the pre-up data input unit 5215 and the pre-down data input unit 5225 decreases.

Thus, the interplay between the operation voltage VDD and the width of individual MOS transistors inside an activate tri-state inverter 5213 reveal how maintain a desired slew rate. The width of individual MOS transistors inside an activate tri-state inverter 5213 correlate with the width of the entire activated tri-state inverter. When the width of the entire activated tri-state inverter decreases, drive capacity of the pre-driver 520 decreases. Therefore, even though increasing the operation voltage VDD causes the slew rate to increase, the decreased drive capacity of pre-driver 520 may lead to a corresponding decrease of the input signal slew rate. However, when a width of the entire activated tri-state inverter increases, drive capacity of the pre-driver 520 increases. Likewise, although decreasing the operation voltage VDD causes the slew rate to decrease, the increased drive capacity of pre-driver 520 may lead to a corresponding increase of the input signal slew rate.

Through this operation, the pre-driver 520 may stably adjust the slew rates of an input signal passing through the pre-up data input unit 5215 and the pre-down data input unit 5225 so as to be a desired maximum and minimum slew rate. The signal with the slew rate adjusted stably is outputted through the main driver 530.

As a result, in one example embodiment, the data output buffer circuit 500 may vary the sum of sizes of activated tri-state inverters based on an inversely proportional relationship between the activated tri-state inverters themselves and the operation voltage VDD. The drive capacity of the pre-driver 520 varies according to the sum of the sizes of activated tri-state inverters. This permits the stable adjustment of the slew rate of input signals passing through the pre-up data input unit 5215 and the pre-down data input unit 5225. As the slew rate of the signal is adjusted stably, the data output buffer circuit and the semiconductor memory device including the same may ensure quality of signal, regardless of variation in operation voltage.

Figure 3:
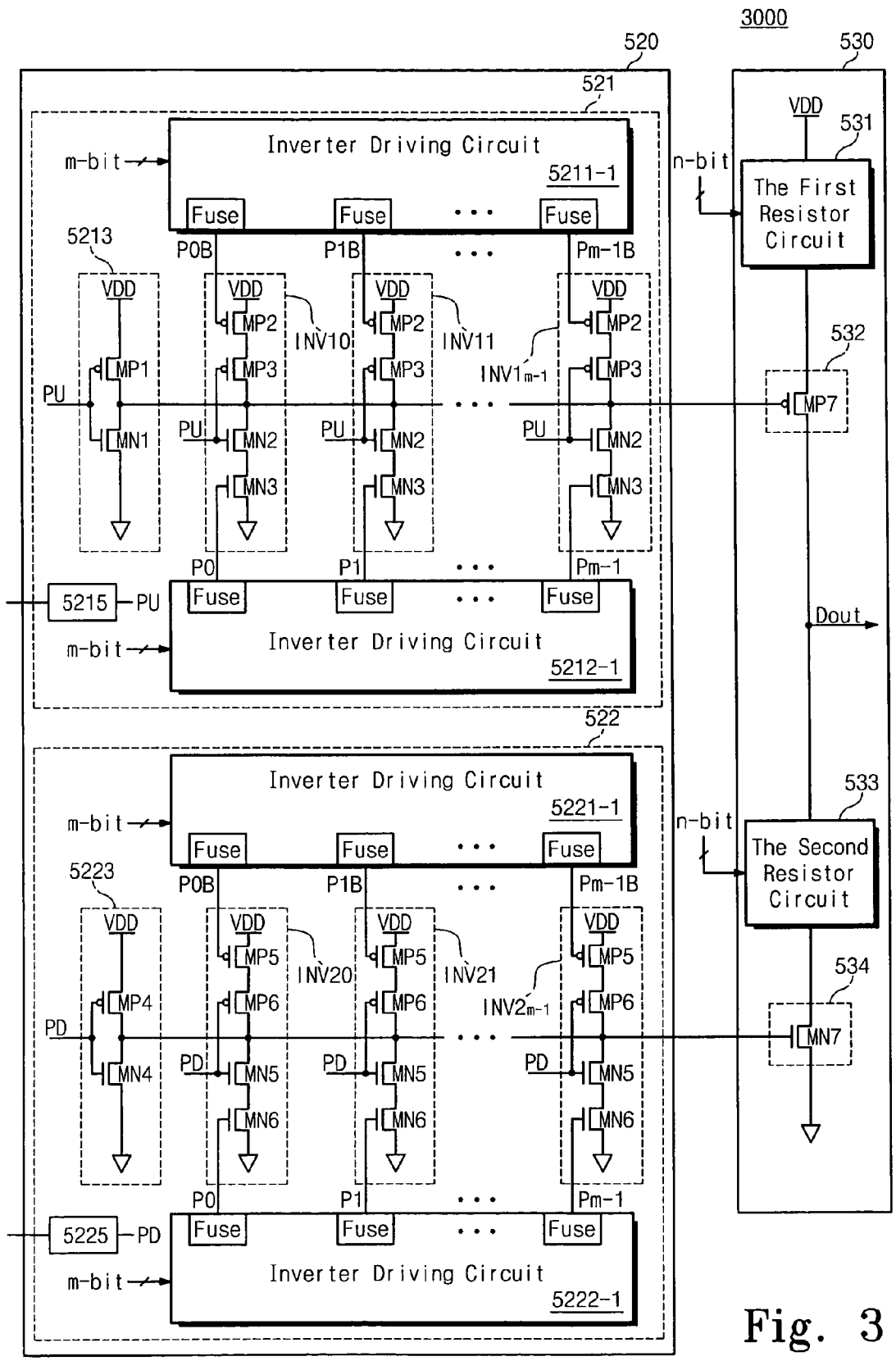
FIG. 3 is a block diagram of a pre-driver 520 and a main driver 530 according to another example embodiment.

FIG. 3 is a block diagram of the pre-driver and main driver according to a second example embodiment of the system illustrated in FIG. 1. In the drivers 3000 in FIG. 3, a first pre-driver 521 includes an inverter driving circuit 5211-1 and another inverter driving circuit 5212-1. Likewise, a second pre-driver 522 includes an inverter driving circuit 5221-1 and another inverter driving circuit 5222-1. The inverter driving circuits 5211-1, 5212-1, 5221-1 and 5222-1 each includes a plurality of fuse circuits (Fuse) for generating control signals P0-Pm-1 and P0B-Pm-1B. The inverter driving circuits 5211-1 and 5221-1 may generate control signals P0B-Pm-1B in response to a 5-bit binary code supplied from the ZQ calibration circuit 510. The inverter driving circuits 5212-1 and 5222-1 may generate control signals P0-Pm-1 in response to the 5-bit binary code supplied from the ZQ calibration circuit 510. In particular, the control signals are generated by the fuse circuit.

In the example embodiment illustrated in FIG. 3, when a low level control signal L is generated, the fuse circuits are electrically isolated. For example, when five control signals are generated, the fuse circuits for generating control signals P3 and P4 are electrically isolated so that the output control signals P0-P4 is "11100". Thus, pre-driver 520 and the main driver 530 of FIG. 3 may operate in the same way as the pre-driver 520 and main driver 530 of FIG. 2 (a description thereof is therefore omitted). As a result, the data output buffer circuit and the semiconductor memory device including the same according to the example embodiment in FIG. 3 may ensure quality of a signal, regardless of variation in operation voltage.

Figure 4:
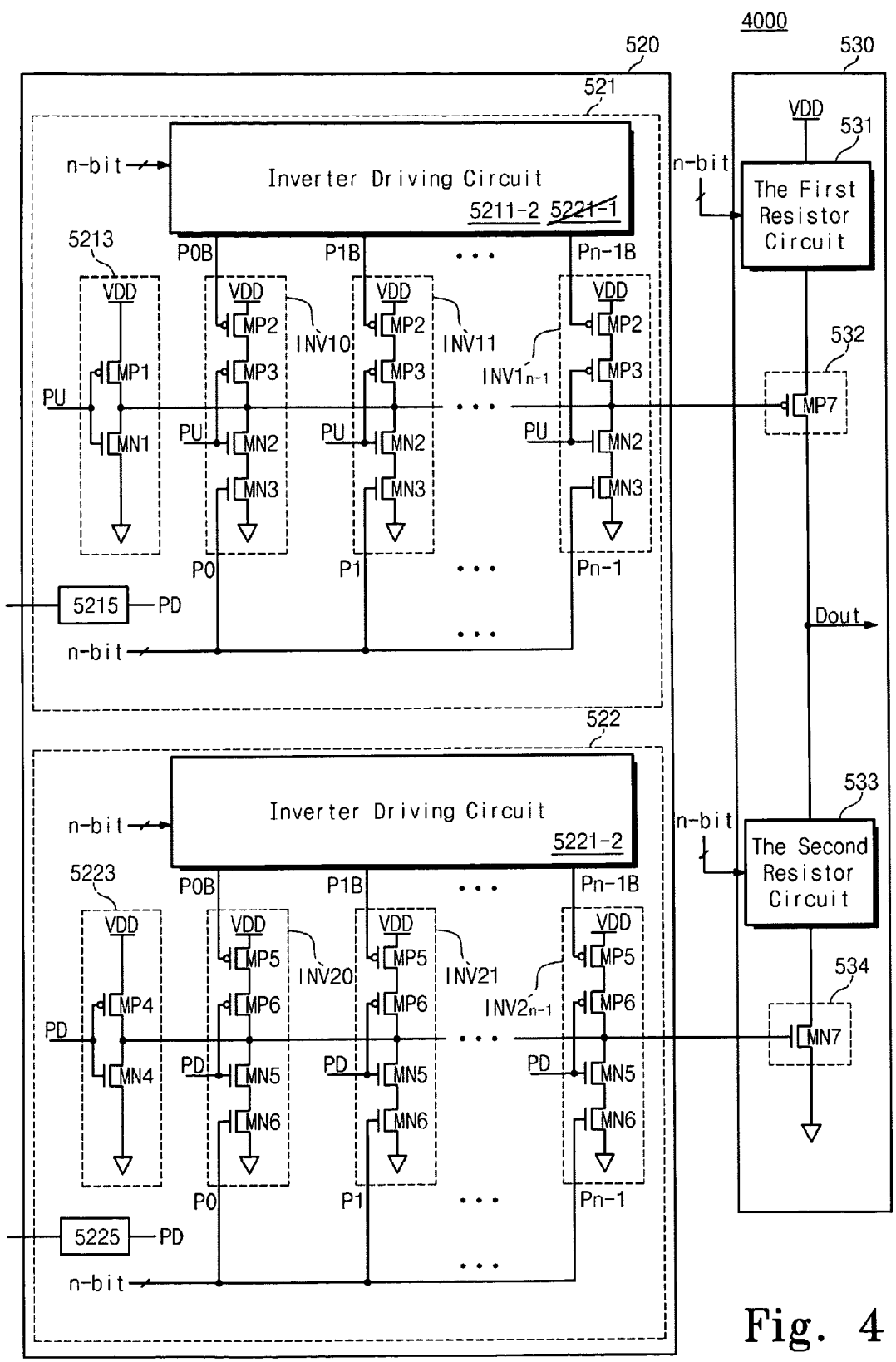
FIG. 4 is a block diagram of a pre-driver 520 and main driver 530 according to a third example embodiment.

FIG. 4 is a block diagram of the pre-driver and main driver according to a third example embodiment of the system illustrated in FIG. 1. In the drivers 4000 in FIG. 4, a ZQ calibration circuit 510 may provide an n-bit signal, which is decoded from an m-bit binary code to first and second pre-drivers 521 and 522. Control signals P0-Pn-1 and P0B-Pn-1B may be generated using the n-bit signal. Also, number of the control signals P0-Pn-1 and P0B-Pn-1B are equal to the n-bit signal. For example, if the signal supplied from the ZQ calibration circuit 510 is a 32-bit signal, the 32-bit signal is used as thirty-two control signals P0-P31. Also, the inverted 32-bit signal is inverted by the inverter driving circuits 5211-2 and 5221-2 so that the inverted 32-bit signal is used as control signals P0B-P31B. The first pre-driver 521 and the second pre-driver 522 may each include 32 tri-state inverters INV1_0-INV1_31, and INV2_0-INV2_31. The tri-state inverters INV1_0-INV1_31, and INV2_0-INV2_31 each may be controlled by each corresponding thirty-two control signals P0-P31, and P0B-P31B. Other configurations of the pre-driver 520 and the main driver 530 of FIG. 4 are identical to that of the pre-driver 520 and main driver 530 of FIG. 2, therefore, description thereof is omitted.

Widths of the tri-state inverters INV1_0-INV1_31, and INV2_0-INV2_31 of FIG. 4 are all identical. Referring to the aforementioned example, when the ZQ calibration circuit 510 generates a 5-bit binary code "11100", seven bits from the lowest bits among the 32-bit signals outputted from the ZQ calibration circuit 510 have high level values H. Control signals P0-P6 and control signals P7B-P31B among the control signals P0-P31 and P0B-P31B are high levels H, and the remaining control signals P7-P31 and P0B-P6B are low levels L. As a result, seven tri-state inverters INV1_0-INV1_6, and INV2_0-INV2_6 are activated. The sum of sizes of the activated tri-state inverters INV1_0-INV1_6 and the sum of sizes of the activated tri-state inverters INV2_0-INV2_6 is equal to a value corresponding to a 5-bit binary code value "11100" (or, a decimal number "7").

In regards to operation, the number of activated tri-state inverters decreases as the operation voltage VDD increases. As the number of activated tri-state inverters decreases, a sum of sizes of the activated tri-state inverters decreases. As a result, even though an increased operation voltage VDD may increase the slew rate, the activated tri-state inverters cause a decrease in the drive capacity of the pre-driver 520, which decreases the slew rate. Likewise, since a decreased operation voltage VDD increases the number of activated tri-state inverters, an increase in the number of activated inverters corresponds with an increase in the sum of sizes of the activated tri-state inverters increases. So even though the slew rate may decrease by the decreased operation voltage VDD, the activated tri-state inverters cause an increase in the drive capacity of the pre-driver 520, which increases the slew rate. This operation permits the stable adjustment of the input signal slew rate passing through a pre-up data input unit 5215 and a pre-down data input unit 5225. The signal having a stably adjusted slew rate is outputted through the main driver 530. This slew adjustment operation is identical to that described in regard to FIG. 2, therefore, a detailed description is omitted for brevity. Accordingly, the data output buffer circuit and the semiconductor memory device including the same according to the third example embodiment illustrated in FIG. 4 may ensure quality of signal, regardless of variation in operation voltage.

Figure 5:
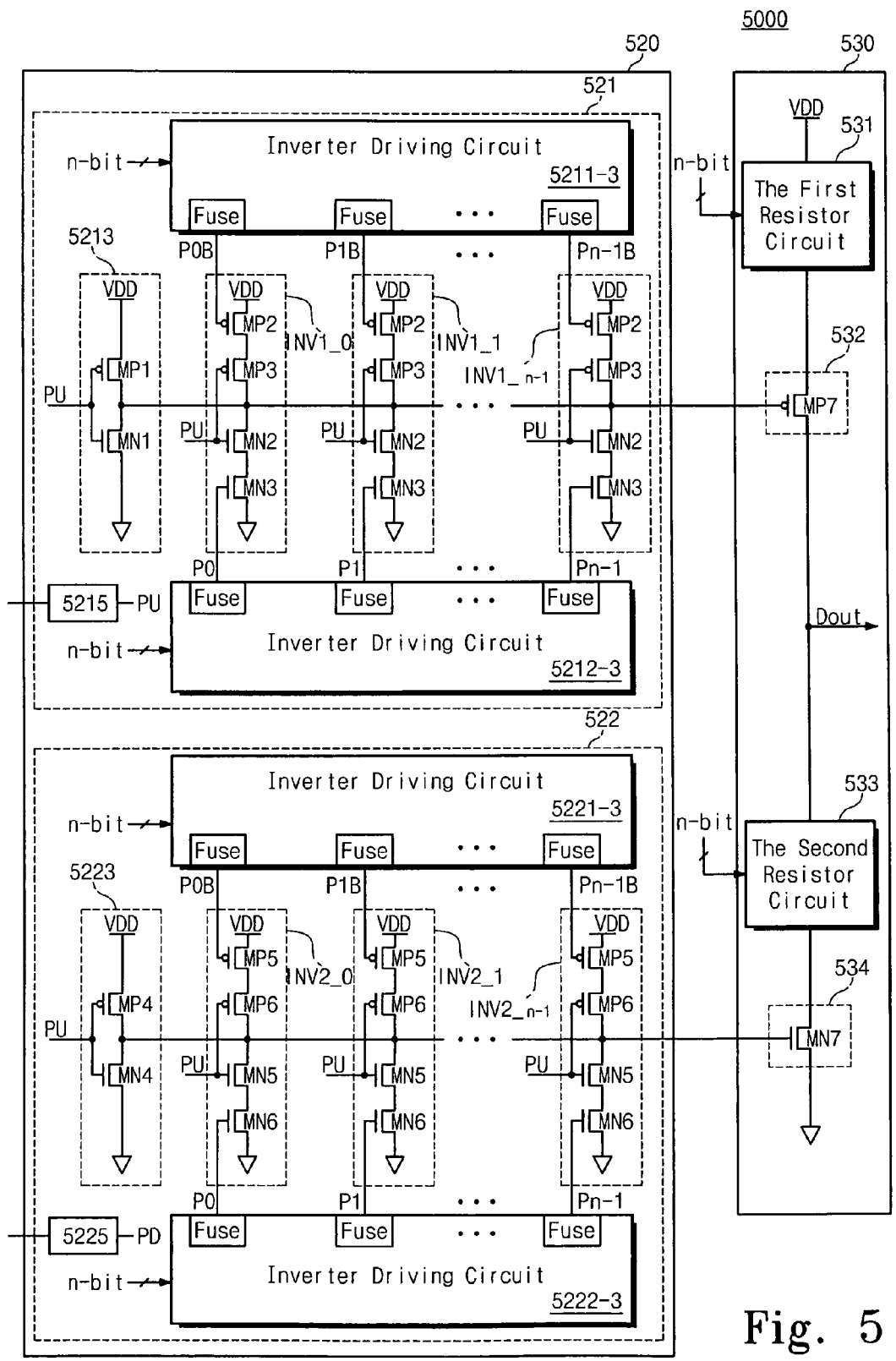
FIG. 5 is a block diagram of a pre-driver 520 and a main driver 530 according to a fourth example embodiment.

FIG. 5 is a block diagram of a pre-driver and a main driver according to a fourth exemplary embodiment of the system illustrated in FIG. 1. In the drivers 5000 in FIG. 5, a first pre-driver 521 includes an inverter driving circuit 5211-3 and another inverter driving circuit 5212-3. Likewise, a second pre-driver 522 includes an inverter driving circuit 5221-3 and another inverter driving circuit 5222-3. The first to fourth inverter driving circuits 5211-3, 5212-3, 5221-3, and 5222-3 each include a plurality of fuse circuits (Fuse) for generating control signals P0-Pn-1 and P0B-Pn-1B. The inverter driving circuits 5211-3 and 5221-3 may generate control signals P0B-Pn-1B in response to an n-bit signal (e.g. a 32-bit) signal supplied from a ZQ calibration 510. The inverter driving circuits 5212-3 and 5222-3 may generate control signals P0-Pm-1 in response to the n-bit signal (e.g. a 32-bit) signal supplied from a ZQ calibration 510. The control signals P0-Pn-1 and P0B-Pn-1B may be generated by the fuse circuits.

In the example embodiment illustrated in FIG. 5, when a low level control signal L is generated, the fuse circuits are electrically isolated. For example, as described in FIG. 4, when the ZQ calibration circuit 510 generates a 5-bit binary code "11100", control signals P0-P6, of the control signals P0-P31, are at a high level H, and the remaining control signals P7-P31 are at low level L. Accordingly, the fuse circuits P7-P31, which generate the low level L control signals, may be electrically isolated. Since the operation of the pre-driver 520 and the main driver 530 illustrated in FIG. 5 may function substantially the same way as the pre-driver 520 and main driver 530 of FIG. 2, description thereof is omitted.

In the illustrated example embodiments, the pre-driver 520 is configured to have two pre-sub-drivers 521 and 522. However, the pre-driver 520 may have a plurality of pre-sub-drivers. Also, the inverter driving circuits 5211 (including 5211-1, 5211-2, and 5211-3) and 5221 (including 5221-1, 5221-2, and 5221-3), along with the inverter driving circuits 5212-1 (including 5212-3) and 5222-1 (including 5222-3), respectively, may generate the same control signals, and therefore, may be labeled the same. For example, inverter driving circuits 5211-1 and 5212-1 may be each named a first inverter drive circuit, and inverter driving circuits 5212-1 and 5222-1 may be each named a second inverter drive circuit.

Figure 6:
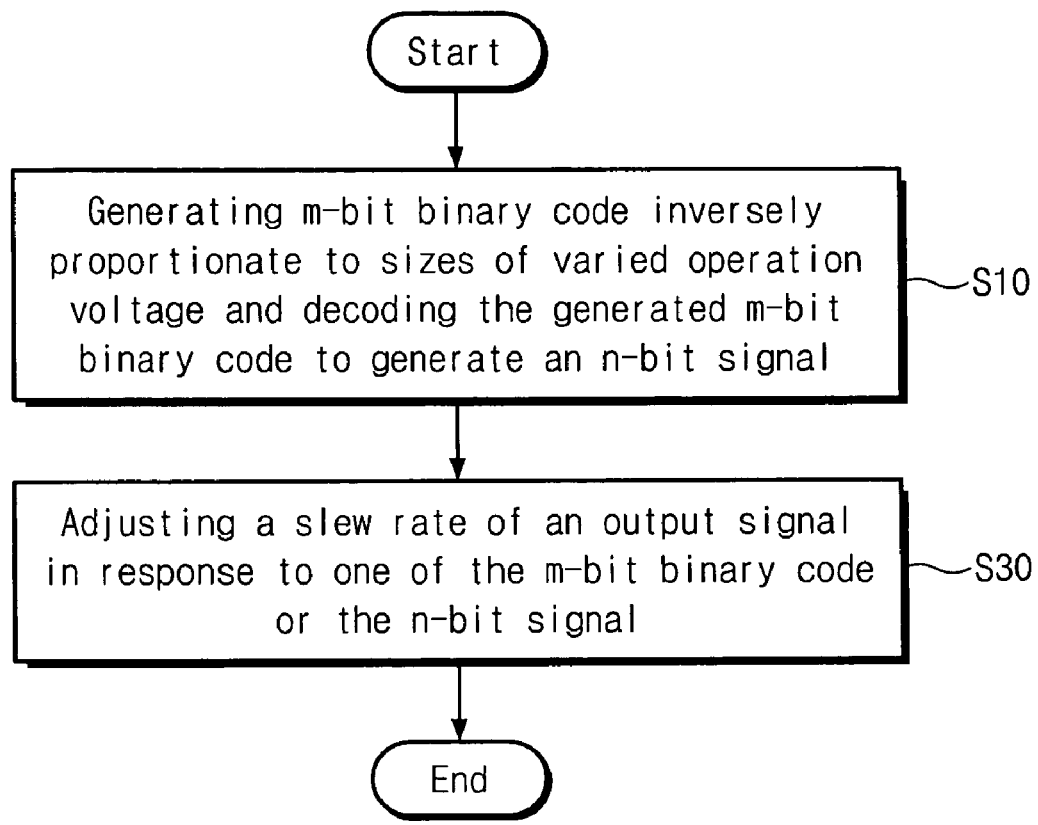
FIG. 6 is a flow chart illustrating the output operation of a data output buffer circuit according to an example embodiment.

FIG. 6 is a flow chart illustrating an output operation of a data output buffer circuit according to an example embodiment. In FIG. 6, an m-bit binary code inversely proportional to the varied operation voltage is generated in step S10, and an n-bit signal decoded from the generated m-bit binary code is generated (m<n). The slew rate of the output signal may be adjusted in response to one of either the m-bit binary code or n-bit signal in step S30. When the operation voltage is increased, the slew rate of the output signal is decreased, and when the operation voltage is decreased, the slew rate of the output signal is increased. As a result, the data output buffer circuit and the semiconductor memory device operating according to the method described above may ensure quality of signal, regardless of variation in operation voltage.

Although the present invention has been described in connection with example embodiments illustrated in the accompanying drawings, it is not limited thereto. Persons with skill in the art will recognize that example embodiments may be applied to other types of memory devices. The above-disclosed subject matter is to be considered illustrative, and not restrictive, and the appended claims are intended to cover all such modifications, enhancements, and other embodiments, which fall within the true spirit and scope of the claimed subject matter. Thus, to the maximum extent allowed by law, the scope of the is to be determined by the broadest permissible interpretation of the following claims and their equivalents, and shall not be restricted or limited by the foregoing detailed description.

What is claimed is:

1. A data output buffer circuit comprising:
   a pre-driver configured to adjust a slew rate of an input signal;
   a main driver configured to drive an output unit in response to an output signal from the pre-driver; and
   a calibration circuit configured to generate an m-bit binary code based on a variation in an operation voltage and decode the m-bit binary code into an n-bit signal, the calibration circuit configured to control the pre-driver so as to decrease the slew rate if the operation voltage increases, and increase the slew rate if the operation voltage decreases,
   wherein the pre-driver includes a first pre-driver and a second pre-driver, each of the first and second pre-drivers including,
      an inverter configured to invert the input signal;
      a plurality of tri-state inverters configured to provide the inverted input signal to the main driver; and
      a first inverter drive circuit configured to invert the n-bit signal, wherein the tri-state inverters are selectively activated in response to the n-bit signal and the inverted n-bit signal.

2. The data output buffer circuit of claim 1, wherein the calibration circuit is configured to control the main driver so as to maintain an output impedance at a set level, irrespective of the variation in the operation voltage.

3. The data output buffer circuit of claim 1, wherein the m-bit binary code is inversely proportional to a size of the operation voltage, and m-bits is less than n-bits.

4. The data output buffer circuit of claim 1, wherein the slew rate is adjusted in accordance with a sum of sizes of the activated tri-state inverters among the tri-state inverters, and the sum of the sizes of the activated tri-state inverters corresponds to the m-bit binary code.

5. The data output buffer circuit of claim 4, wherein the sum of sizes of the activated tri-state inverters decreases if the operation voltage increases.

6. The data output buffer circuit of claim 4, wherein the sum of sizes of the activated tri-state inverters increases if the operation voltage decreases.

7. The data output buffer circuit of claim 1, wherein each of the first and second pre-drivers further includes a second inverter drive circuit, and each of the first and second inverter drive circuits includes a plurality of fuse circuits.

8. The data output buffer circuit of claim 7, wherein the fuse circuits of the first inverter drive circuit are configured to generate control signals for controlling n-numbered tri-state inverters in response to the inverted n-bit signal, and the fuse circuits of the second inverter drive circuit are configured to generate control signals for controlling n-numbered tri-state inverters in response to the n-bit signal.

9. The data output buffer circuit of claim 1, wherein the number of the tri-state inverters is n, and the sizes of the tri-state inverters are identical.

10. A data output buffer circuit comprising:
a pre-driver configured to adjust a slew rate of an input signal;
a main driver configured to drive an output unit in response to an output signal from the pre-driver; and
a calibration circuit configured to generate an m-bit binary code based on a variation in an operation voltage, the calibration circuit configured to control the pre-driver so as to decrease the slew rate if the operation voltage increases, and increase the slew rate if the operation voltage decreases,
wherein the pre-driver includes a first pre-driver and a second pre-driver, each of the first and second pre-drivers including,
an inverter configured to invert the input signal;
a plurality of tri-state inverters configured to provide the inverted input signal to the main driver; and
a first inverter drive circuit configured to invert the m-bit binary code, and wherein the tri-state inverters are selectively activated in response to the m-bit binary code and the inverted m-bit binary code.

11. The data output buffer circuit of claim 10, wherein each of the first and second pre-drivers further includes a second inverter drive circuit, and each of the first and second inverter drive circuits includes a plurality of fuse circuits.

12. The data output buffer circuit of claim 11, wherein the fuse circuits of the first inverter drive circuit are configured to generate control signals for controlling m number of tri-state inverters in response to the inverted m-bit binary code, and the fuse circuits of the second inverter drive circuit are configured to generate control signals for controlling m-numbered tri-state inverters in response to the m-bit binary code.

13. The data output buffer circuit of claim 10, wherein the number of the tri-state inverters is m, and sizes of respective tri-state inverters increase in multiples of 2 sequentially.

14. A semiconductor memory device comprising:
a cell array including a plurality of memory cells arranged in intersections of the rows and columns;
a row decoder and a column decoder configured to select locations of memory cells in response to address information; and
a data output buffer circuit configured to output data read from selected memory cells, wherein the data output buffer circuit includes the data output buffer circuit of claim 1.

15. A data output buffer circuit comprising:
a pre-driver configured to adjust a slew rate of an input signal, the pre-driver including at least a first pre-driver and a second pre-driver;
a main driver configured to drive an output unit in response to the output signal from the pre-driver; and
a calibration circuit configured to control the pre-driver such if the operation voltage increases, the slew rate decreases, and if the operation voltage decreases the slew rate increases,
wherein each of the first and second drivers includes,
an inverter configured to invert the input signal;
a plurality of tri-state inverters configured to provide the inverted input signal to the main driver; and
a first inverter drive circuit configured to invert a bit signal such that the tri-state inverters are selectively activated in response to the bit signal and the inverted bit signal.

16. The data output buffer circuit of claim 15, wherein each of the first and second pre-drivers further includes,
a second inverter drive circuit;
wherein each of the first and second inverter drive circuits includes a plurality of fuse circuits.

17. The data output buffer circuit of claim 10, wherein the m-bit binary code is inversely proportional to the size of the operation voltage.

18. The data output buffer circuit of claim 10, wherein the slew rate is adjusted in accordance with a sum of sizes of the activated tri-state inverters among the tri-state inverters, and the sum of the sizes of the activated tri-state inverters corresponds to the m-bit binary code.

19. A semiconductor memory device comprising:
a cell array including a plurality of memory cells arranged in intersections of the rows and columns;
a row decoder and a column decoder configured to select locations of memory cells in response to address information; and
a data output buffer circuit configured to output data read from selected memory cells, wherein the data output buffer circuit includes the data output buffer circuit of claim 10.

* * * * *